(12) United States Patent
Lindahl et al.

(10) Patent No.: US 7,142,403 B2
(45) Date of Patent: Nov. 28, 2006

(54) METHOD FOR DETECTION OF A GROUND FAULT, WHICH OCCURS IN THE VICINITY OF A NEUTRAL POINT IN AN ELECTRICAL DEVICE, AS WELL AS AN APPARATUS FOR CARRYING OUT THE METHOD

(75) Inventors: Goeran Lindahl, Vacsteras (SE); Erland Soerensen, Vacsteras (SE)

(73) Assignee: Alstom Technology Ltd., Baden (CH)

( * ) Notice: Subject to any disclaimer, the term of this patent is extended or adjusted under 35 U.S.C. 154(b) by 206 days.

(21) Appl. No.: 10/847,475

(22) Filed: May 18, 2004

(65) Prior Publication Data

US 2004/0264079 A1 Dec. 30, 2004

Related U.S. Application Data

(63) Continuation of application No. PCT/IB02/04687, filed on Nov. 7, 2002.

(30) Foreign Application Priority Data

Nov. 19, 2001 (CH) ..................................... 2113/01

(51) Int. Cl.
*H02H 3/00* (2006.01)
*H02H 9/08* (2006.01)
*H02H 3/16* (2006.01)
*H02H 3/26* (2006.01)
*H02H 3/32* (2006.01)

(52) U.S. Cl. .............................. 361/42; 361/44; 361/47
(58) Field of Classification Search .................. 361/42, 361/44, 47
See application file for complete search history.

(56) References Cited

U.S. PATENT DOCUMENTS

| 4,151,460 | A | * | 4/1979 | Seese et al. ................. 324/529 |
| 4,228,475 | A | | 10/1980 | Sherwood |
| 4,608,619 | A | * | 8/1986 | Bomer et al. ................. 361/31 |
| 4,698,756 | A | | 10/1987 | Gonzalez et al. |
| 4,901,070 | A | | 2/1990 | Vandevier |
| 5,917,334 | A | | 6/1999 | Grunewald et al. |
| 6,064,172 | A | | 5/2000 | Kuznetsov |

FOREIGN PATENT DOCUMENTS

| EP | 61091576 | 5/1986 |
| EP | 63055472 | 3/1988 |
| EP | 03098214 | 4/1991 |
| EP | 10271651 | 10/1998 |
| WO | 01/50566 A1 | 7/2001 |
| WO | 03/044546 A1 | 5/2003 |

* cited by examiner

*Primary Examiner*—Stephen W. Jackson
*Assistant Examiner*—Dharti H. Patel
(74) *Attorney, Agent, or Firm*—Cermak & Kenealy, LLP; Adam J. Cermak

(57) ABSTRACT

The invention relates to a method for detection of a ground fault (18), which occurs in the vicinity of a neutral point (22), in a polyphase electrical device which is operated at a fundamental frequency, in particular an electrical machine (10) or a transformer which has a number of windings (11, 12, 13), which are associated with the individual phases, one end of each of which windings (11, 12, 13) is connected to the neutral point (22) and the other end of each of which windings (11, 12, 13) is connected directly to a power supply network via a power supply system connection (14, 15, 16). Simple and reliable detection is achieved in that the change in the physical variables which is associated with a ground fault (18) is measured in the immediate vicinity of the ground fault (18), and is evaluated.

9 Claims, 2 Drawing Sheets

METHOD FOR DETECTION OF A GROUND FAULT, WHICH OCCURS IN THE VICINITY OF A NEUTRAL POINT IN AN ELECTRICAL DEVICE, AS WELL AS AN APPARATUS FOR CARRYING OUT THE METHOD

This application is a Continuation of and claims priority under 35 U.S.C. § 120 to International application number PCT/IB02/04687, filed 7 Nov. 2002, and claims priority under 35 U.S.C. § 119 to Swiss application number 2001 2113/01, filed 19 Nov. 2001, the entireties of both of which are incorporated by reference herein.

BACKGROUND OF THE INVENTION

1. Field of the Invention

The invention relates to the field of protection of electrical devices such as electrical machines or transformers. It relates in particular to a method for detection of a ground fault, which occurs in the vicinity of a neutral point, in a polyphase electrical device, which is operated at a fundamental frequency. It also relates in particular to an apparatus for carrying out the method as well as to an application of the method.

2. Brief Description of the Related Art

A large number of methods are known from the prior art, by means of which ground faults or ground shorts in the windings of rotating machines such as synchronous generators are detected, and the machine can thus be protected against the negative effects of ground faults. These methods include the use of an overvoltage or overcurrent relay at the neutral point, a zero voltage (zero sequence) overvoltage relay, or a residual current differential protection circuit.

Ground fault protection for a generator based on overvoltage or overcurrent determination results in simple and reliable protection. However, it has one major disadvantage: ground faults which occur in the windings close to the neutral point of the generator are not detected. It has therefore already been proposed (Charles J. Mozina, Upgrading Hydroelectric Generator Protection Using Digital Technology, Waterpower '97, Atlanta Ga., Aug. 5–8 (1997)) for one hundred percent ground fault protection to be achieved by combining a conventional overvoltage protection circuit (for 95% of the stator winding) with an undervoltage protection circuit which is tuned to the third harmonic of the generator fundamental frequency (for the remaining 5% of the winding close to the neutral point). This proposal is based on the fact that, in many synchronous generators, the inducted electromotive voltage at the neutral point contains higher harmonics, which produce a corresponding high harmonic current in the connection from the neutral point to ground, in general a resistance. If an earth fault occurs in the vicinity of the neutral point, it acts as a bypass for this resistance. The reduction in the voltage drop which results from the bypass can then be detected as an undervoltage. These known ground fault protection methods are supported by the use of step-up transformers between the generator and the power supply system, which allow the generator to be isolated from the power supply system with regard to grounding.

However, recently, power station configurations are being increasingly used in which there is no need for the conventional step-up transformers, since the generators produce the power supply system voltage directly. This is achieved by means of a special winding technology, in which the windings of the generator use high-voltage cables. Generators such as these have become known by the name "Powerformer" (see, for example, M. Leijon, "Powerformer—a radically new rotating machine", ABB review 2/98, pp. 21–26 (1998)).

It has now been found that the known methods for detection of ground faults in these rotating machines and transformers which are designed using the new winding technique do not operate with one hundred percent reliability.

SUMMARY OF THE INVENTION

The object of the method is to specify a method and an apparatus which avoid the disadvantages of previously known solutions and, in particular, allow simple and reliable detection of ground shorts or ground faults close to the neutral point of electrical machines and transformers which are wound with cables and are connected directly to the power supply system.

The essence of the invention is to use instrumentation to detect the effects of a ground fault in the immediate vicinity of the ground fault, which effects are expressed in a change in specific physical variables such as the temperature or pressure, and to use these effects for detection of the ground fault.

According to a first preferred refinement of the method according to the invention, the temperature and/or the gas or air pressure are/is measured and evaluated as the physical variables. This is achieved in a particularly simple and reliable manner in that the change is measured optically by means of fiber-optic cables which are laid parallel to the high-voltage cable in the windings and are sensitive to temperature and/or pressure fluctuations.

A second preferred refinement of the method according to the invention is distinguished in that a high-voltage cable with a built-in gas-filled tube is used for the windings, and in that the change in the gas pressure in the tube is measured and evaluated.

A corresponding apparatus is characterized in that the measured value recording means comprise fiber-optic cables which are sensitive to temperature and/or pressure fluctuations and are laid parallel to the high-voltage cable in the windings, and in that the high-voltage cables each have a gas-filled tube, and in that the measured value recording means comprise pressure sensors which are connected to the tubes.

BRIEF DESCRIPTION OF THE DRAWINGS

The invention will be explained in more detail in the following text using exemplary embodiments and in conjunction with the drawing, in which.

DETAILED DESCRIPTION OF THE PREFERRED EMBODIMENTS

Figure 1:
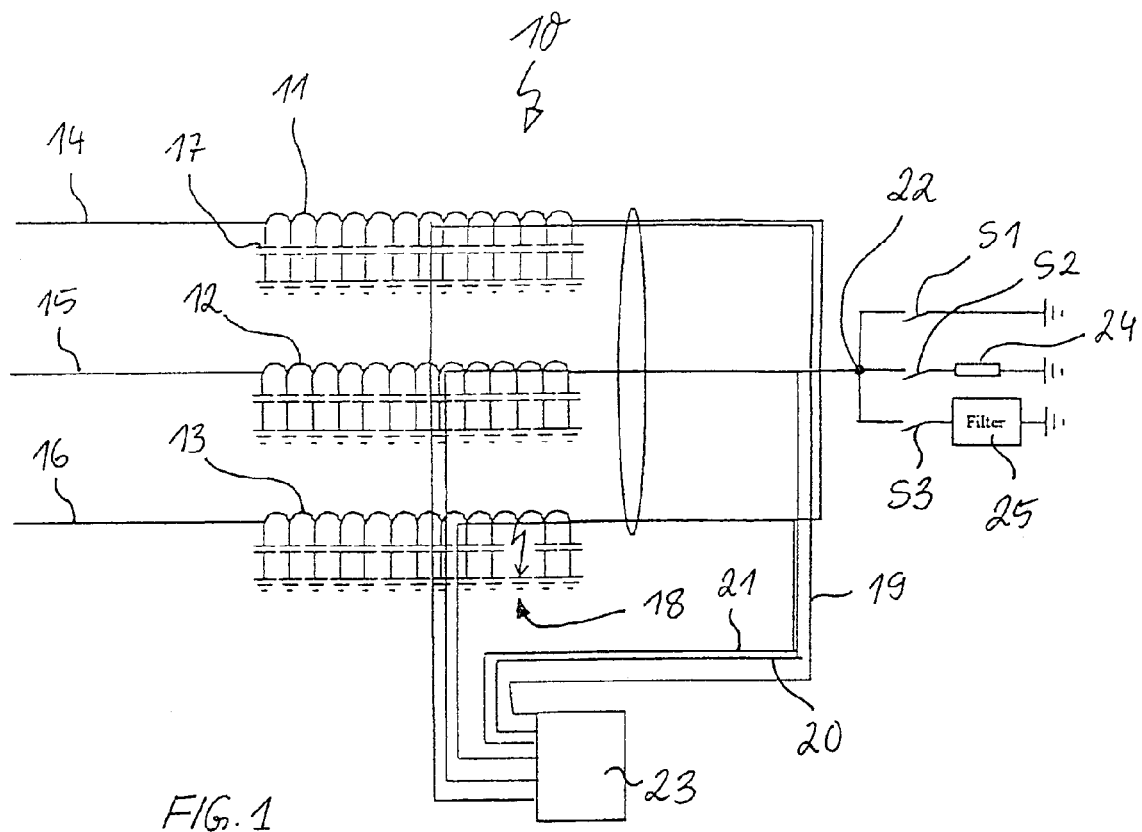
FIG. 1 shows a schematic illustration of a first exemplary embodiment of an apparatus according to the invention for ground fault detection by means of fiber-optic cables which are laid parallel to the winding cables.

According to the invention, a possible ground fault is detected by a measurement of specific physical variables, which change as a result of the ground fault. FIG. 1 shows a schematic illustration of a first exemplary embodiment of an apparatus according to the invention for ground fault or ground short detection in the windings 11, 12 and 13 of an electrical machine 10. The windings 11, 12, 13, which are designed using high-voltage cables, are connected on the one side via power supply system connections 14, 15 and 16 directly to a power supply system (which is not illustrated). On the other side, the windings 11, 12 and 13 are connected to a neutral point 22, which can be connected to ground via switches S1, . . . , S3 either directly, via a resistance 24 or via a filter 25. The windings 11, 12 and 13 have ground capacitances 17 which are distributed with respect to ground, as is indicated in FIG. 1.

A fiber-optic cable 19, 20, 21, which is sensitive to temperature and/or pressure fluctuations, is connected at both ends to an evaluation unit and forms a closed measured loop, is in each case laid in the windings 11, 12, 13, in a section close to the neutral point 22 and parallel to the high-voltage cable of the winding. If a ground fault now occurs in one of the windings 11, 12, 13, in the winding 13 in the example in FIG. 1, the fault current flowing there results in a local change at least in the temperature, and in general also in the air pressure in the immediate vicinity. These changes affect the optical characteristics of the relevant fiber-optic cable 21, which can be detected and evaluated in the evaluation unit 23, by means of fiber-optic measurement methods which are known per se.

Figure 2:
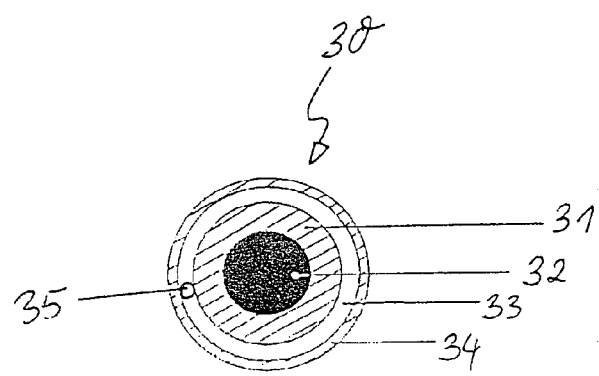
FIG. 2 shows a cross section through a cable which is used in the windings, having an intermediate space which is suitable for carrying out a ground fault detection method according to one exemplary embodiment of the invention.
Figure 3:
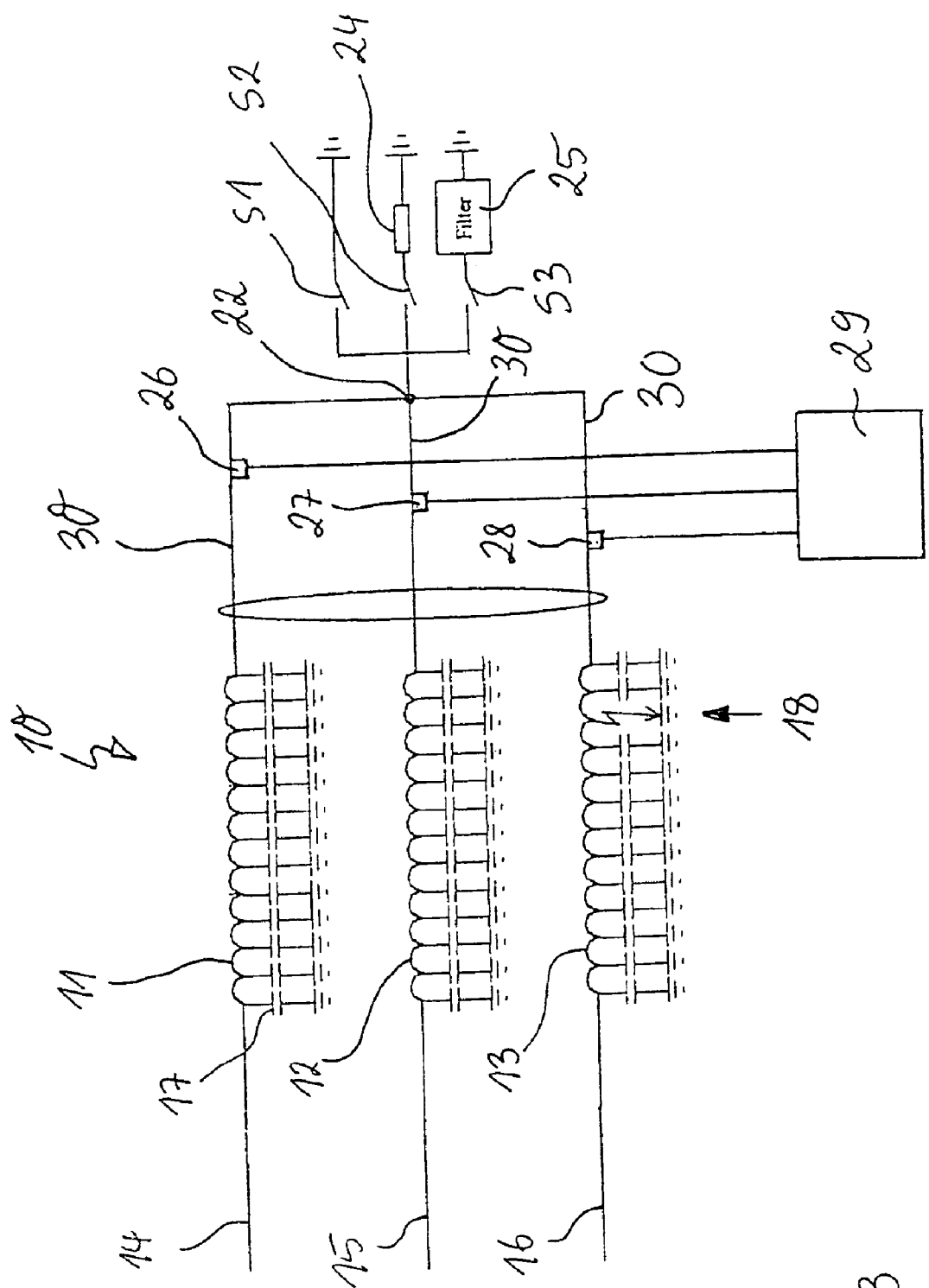
FIG. 3 shows a schematic illustration of a second exemplary embodiment of an apparatus according to the invention for ground fault detection by means of pressure sampling in a winding cable as shown in FIG. 2.

FIG. 3 shows a schematic illustration of a second exemplary embodiment of an apparatus according to the invention for ground fault detection in the windings 11, 12 and 13 of an electrical machine 10. The same reference symbols in this case denote the same elements as in FIG. 1. In this case, a specific high-voltage cable 30 is used to form the windings 11, 12, and 13, and its internal design is shown in simplified form in the cross-sectional illustration in FIG. 2. Like the high-voltage cable which is used for the windings 11, 12, 13 in FIG. 1, the high-voltage cable 30 is a so-called XLPE cable (XLPE in this case stands for cross-linked polyethylene, see, for example, the article by B. Dellby et al. "High-voltage XLPERFORMANCE cable technology, ABB review 4/2000, pages 35–44 (2000)). In the XLPE cable, the central conductor 32 is generally surrounded by insulation composed of XLPE. The special feature of the high-voltage cable 30 shown in FIG. 2 is now that an intermediate space 33 is arranged between first and second insulation 31 and 34, respectively. A tube which is filled with gas can be laid in a spiral shape in this intermediate space 33. Sulfurhexafluoride is used, in particular, as the filling gas in this case.

According to FIG. 3, pressure sensors 26, 27, 28 can now be arranged at one or more points on the high-voltage cable 30 and on the windings 11, 12, 13. In the event of a ground fault 18, gas emerges from the tube, and the pressure change which is associated with this can be measured by means of the pressure sensors 26, 27, 28, and can be evaluated in a connected evaluation unit 29.

LIST OF REFERENCE SYMBOLS

| | |
|---|---|
| 10 | Electrical machine |
| 11, 12, 13 | Winding |
| 14, 15, 16 | Power supply system connection |
| 17 | Ground capacitance |
| 18 | Ground fault |
| 19, 20, 21 | Fiber-optic cable |
| 22 | Neutral point |
| 23 | Evaluation unit |
| 24 | Resistance |
| 25 | Filter |
| 26, 27, 28 | Pressure sensor |
| 29 | Evaluation unit |
| 30 | High-voltage cable (XLPE) |
| 31 | Insulation (XLPE) |
| 32 | Conductor |
| 33 | Intermediate space |
| 34 | Insulation (XLPE) |
| 35 | Tube (filled, for example, with $SF_6$) |
| S1, S2, S3 | Switch |

LIST OF REFERENCE SYMBOLS

While the invention has been described in detail with reference to preferred embodiments thereof, it will be apparent to one skilled in the art that various changes can be made, and equivalents employed, without departing from the scope of the invention. Each of the aforementioned documents is incorporated by reference herein in its entirety.

What is claimed is:

1. A method for detection of a ground fault, which occurs in the vicinity of a neutral point, in a polyphase electrical device which is operated at a fundamental frequency, which has a number of windings which are associated with the individual phases of a high-voltage cable, one end of each of which windings is connected to the neutral point and the other end of each of which windings is connected directly to a power supply network via a power supply system connection, the method comprising:
   measuring the change in the physical variables which is associated with a ground fault in the immediate vicinity of the ground fault;
   evaluating said change in physical variables; and
   wherein the windings comprise a high-voltage cable with a built-in gas-filled tube, and wherein measuring and evaluating the change comprises measuring and evaluating the change in the gas pressure in the tube.

2. A method for detection of a ground fault, which occurs in the vicinity of a neutral point, in a polyphase electrical device which is operated at a fundamental frequency, which has a number of windings which are associated with the individual phases of a high-voltage cable, one end of each of which windings is connected to the neutral point and the other end of each of which windings is connected directly to a power supply network via a power supply system connection, the method comprising:
   measuring the change in the physical variables which is associated with a ground fault in the immediate vicinity of the ground fault;
   evaluating said change in physical variables;
   wherein the physical variables are selected from the group consisting of the temperature, the gas pressure, the air pressure, and combinations thereof; and
   wherein measuring the change comprises measuring optically with fiber-optic cables which are laid parallel to the high-voltage cable in the windings and are sensitive to temperature fluctuations, pressure fluctuations, or both.

3. An apparatus useful for detection of a ground fault, which fault occurs in the vicinity of a neutral point, in a polyphase electrical device which is operated at a fundamental frequency, which device has a number of windings which are associated with the individual phases of a high-voltage cable, one end of each of which windings is connected to the neutral point and the other end of each of which windings is connected directly to a power supply network via a power supply system connection, the apparatus comprising:
- means for measured value recording of physical variables which change when a ground fault occurs in the windings, configured and arranged to be placed on the individual windings;
- an evaluation unit; and
- wherein the measured value recording means is connected to the evaluation unit;
- wherein the measured value recording means comprises fiber-optic cables which are sensitive to temperature fluctuations, pressure fluctuations, or both, and are configured and arranged to be laid parallel to the high-voltage cable in the windings.

4. An apparatus useful for detection of a ground fault, which fault occurs in the vicinity of a neutral point, in a polyphase electrical device which is operated at a fundamental frequency, which device has a number of windings which are associated with the individual phases of a high-voltage cable, one end of each of which windings is connected to the neutral point and the other end of each of which windings is connected directly to a power supply network via a power supply system connection, the apparatus comprising, the apparatus comprising:
- means for measured value recording of physical variables which change when a ground fault occurs in the windings, configured and arranged to be placed on the individual windings;
- an evaluation unit; and
- wherein the measured value recording means is connected to the evaluation unit;
- high-voltage cables each having a gas-filled tube; and
- wherein the measured value recording means comprises pressure sensors connected to the tubes.

5. The method as claimed in claim 1, wherein the polyphase electrical device comprises an electrical machine or a transformer.

6. The apparatus as claimed in claim 3, wherein the means for measured value recording of physical variables is arranged on the individual windings.

7. The apparatus as claimed in claim 3, further comprising:
- windings including a high-voltage cable in the windings;
- wherein the fiber-optic cables are laid parallel to the high-voltage cable in the windings.

8. The apparatus as claimed in claim 4, wherein the means for measured value recording of physical variables is arranged on the individual windings.

9. The method as claimed in claim 2, wherein the polyphase electrical device comprises an electrical machine or a transformer.

* * * * *